United States Patent [19]

Takahashi et al.

[11] Patent Number: 5,400,160
[45] Date of Patent: Mar. 21, 1995

[54] DISPLAY MEANS FOR APPARATUS WITH TRANSPARENT PANEL FIXED TO LCD PANEL VIA ELASTIC PACKING WITH RIDGES IN ZIG ZAG PATTERN

[75] Inventors: Akira Takahashi, Yokohama; Susumu Otsuki, Yamato; Teruo Nanmoku, Zama, all of Japan

[73] Assignee: Matsushita Electric Industrial Co., Ltd., Osaka, Japan

[21] Appl. No.: 71,804

[22] Filed: Jun. 2, 1993

[30] Foreign Application Priority Data

Jun. 3, 1992 [JP] Japan .................. 4-142454

[51] Int. Cl.⁶ .................. G02F 1/1333; G02F 1/1335
[52] U.S. Cl. .................. 359/83; 359/48
[58] Field of Search .................. 359/48, 83

[56] References Cited

U.S. PATENT DOCUMENTS

| | | | |
|---|---|---|---|
| 4,796,977 | 1/1989 | Drake | 359/83 |
| 5,150,231 | 9/1992 | Iwamoto et al. | 359/83 |
| 5,166,815 | 11/1992 | Elderfield | 359/83 |
| 5,243,453 | 9/1993 | Kawaguchi et al. | 359/83 |

FOREIGN PATENT DOCUMENTS

| | | | |
|---|---|---|---|
| 59-140424 | 8/1984 | Japan | 359/83 |
| 2-093425 | 4/1990 | Japan | 359/83 |
| 4-204822 | 7/1992 | Japan | 359/83 |
| 2121583 | 12/1983 | United Kingdom . | |
| 2234128 | 1/1991 | United Kingdom . | |
| 2261101 | 10/1992 | United Kingdom . | |

OTHER PUBLICATIONS

WPI Abstrast Accession No: 93-177861/22 & JP 5107529—(ROHM) 30.4.93 no date.

*Primary Examiner*—Anita Pellman Gross
*Attorney, Agent, or Firm*—Popham, Haik, Schnobrich & Kaufman, Ltd.

[57] ABSTRACT

A display means for an apparatus comprising a printed circuit board having an integrated circuit etc. for controlling display information; a backlighting plate being fixed on the printed circuit board; a glass-electrode liquid crystal display device which is disposed on the backlighting plate and is electrically connected with the printed circuit board through a flexible printed circuit plate and fixed thereon; a decorative panel being located above the glass-electrode liquid crystal display device; and an elastic packing which is disposed between the glass-electrode liquid crystal display device and the decorative panel and is fixed on this side of the printed circuit board to hold the glass-electrode liquid crystal display device.

1 Claim, 3 Drawing Sheets

DISPLAY MEANS FOR APPARATUS WITH TRANSPARENT PANEL FIXED TO LCD PANEL VIA ELASTIC PACKING WITH RIDGES IN ZIG ZAG PATTERN

BACKGROUND OF THE INVENTION

1. Field of the Invention

The present invention relates to a display means for an apparatus employing an L.C.D. panel.

2. Related Background Art

A display means is conventionally constructed in such a way that an L.C.D. (liquid crystal display) panel is fixed on a printed circuit board by using a metal or plastics holding plate.

FIG. 3 is an exploded perspective view of a usual display means, and FIG. 4 is a sectional view showing a state where an L.C.D. panel held in an usual display means. Referring to FIGS. 3 and 4, reference numeral 1 is an L.C.D. panel, which is provided with a printed circuit board 2 and a flexible printed circuit board 3 for connecting device 1 to board 2. Reference numeral 4 is a metal or plastics holding plate, in which fixing tabs 4a are formed to be engaged into slits 2a provided on printed circuit board 2. Reference numeral 5 is a plastics cushion packing, which is fixedly sandwiched in between an upside surface of L.C.D. panel 1 and an inside surface of holding plate 4.

Reference numeral 6 is a spongy dust-proof packing, which is mounted on holding plate 4. Reference numeral 7 is a backlighting plate, which is fixedly sandwiched in between the underside surface of glass-electrode liquid crystal display device 1 and printed circuit board 2. The backlighting plate 7 usually is a unit into which a light source such as light emitting diode(LED) is incorporated, and transmits light toward glass-electrode liquid crystal display device 1 upward. Reference numeral 8 is a transparent panel, which is made of a transparent material so that display of the L.C.D. panel 1 can be observed, and mounted on dust-proof packing 6.

As shown in FIG. 4, the L.C.D. panel 1 and backlighting plate 7 are sandwiched in between printed circuit board 2 and holding plate 4, which can be fixed by engaging tabs 4a of holding plate 4 into slits 2a of printed circuit board 2. At the same time, cushion packing 5 is closely sandwiched in between the L.C.D. panel 1 and holding plate 4. Dust-proof packing 6 also is fixed on the upside surface of holding plate 4 by a bond etc. Finally, through mounting transparent panel 8 on dust-proof packing 6, the display means is completed.

In this display means, the L.C.D. panel 1 may be protected from breakage due to an impact from the outside, with cushion packing 5. Moreover, dust-proof packing 6 is compressed into an optimum thickness by transparent panel 8, and this allows an area enclosed by dust-proof packing 6, or the display area of an L.C.D. panel 1 to be sealed, thereby, refuse and dust can be prevented from entering the display area.

In a conventional display means, thus cushion packing 5 enables the L.C.D. panel 1 fixed by holding plate 4 to be protected against an impact from the outside, and dust-proof packing 6 permits the display area to be free from an entrance of refuse and dust.

The above conventional display means, however, requires mounting each of cushion packing 5 and dust-proof packing 6 separately so as to hold the L.C.D. panel 1 by means of holding plate 4 made of a material, such as metal or plastics, consequently, there have been the problems of increasing weight of apparatus and the number of components.

SUMMARY OF THE INVENTION

The present invention has been achieved regarding to the above problems, and it is an object of the present invention to provide a useful apparatus which not only may simultaneously attain holding of the L.C.D. panel, its protection from an outside impact, and prevention of refuse and dust entering the display area by one elastic packing, but may perform its functions by using a lesser number of components.

In order to achieve the above object, the present invention comprises a printed circuit board having an integrated circuit for controlling display information; a backlighting plate being fixed on the printed circuit board; an L.C.D. panel is disposed on the backlighting plate and is electrically connected with the printed circuit board through a flexible printed circuit board and fixed thereon; a transparent panel being located above the L.C.D. panel; and an elastic packing which is disposed between the L.C.D. panel and the transparent panel and is fixed on a side of the printed circuit board to which the L.C.D. panel is connected to hold the L.C.D. panel. Moreover, a plurality of ridges are formed on a surface of which the elastic packing contacts with the L.C.D. panel so as to enclose an opening formed inside the elastic packing, and a continuous ridge is formed on a surface of which the elastic packing contacts with the transparent panel so as to enclose said opening, those lips are positioned zigzag with respect to one another on opposing surfaces of the elastic packing, as shown in a sectional view of FIG. 2.

Such an arrangement has an effect of being able to simultaneously realize holding of the L.C.D. panel, protection from an outside impact, and prevention of refuse and dust entering the display area, by using an elastic packing to hold a glass-electrode liquid crystal display device.

In addition, the display means according to the present invention also may be arranged so that the number of components composing the display device is less than those of conventional devices and a height of the display device can be made lower, thereby, the display device has an effect of providing a smaller and lower-priced display means for an apparatus.

DESCRIPTION OF THE PREFERRED EMBODIMENT

Figure 1:
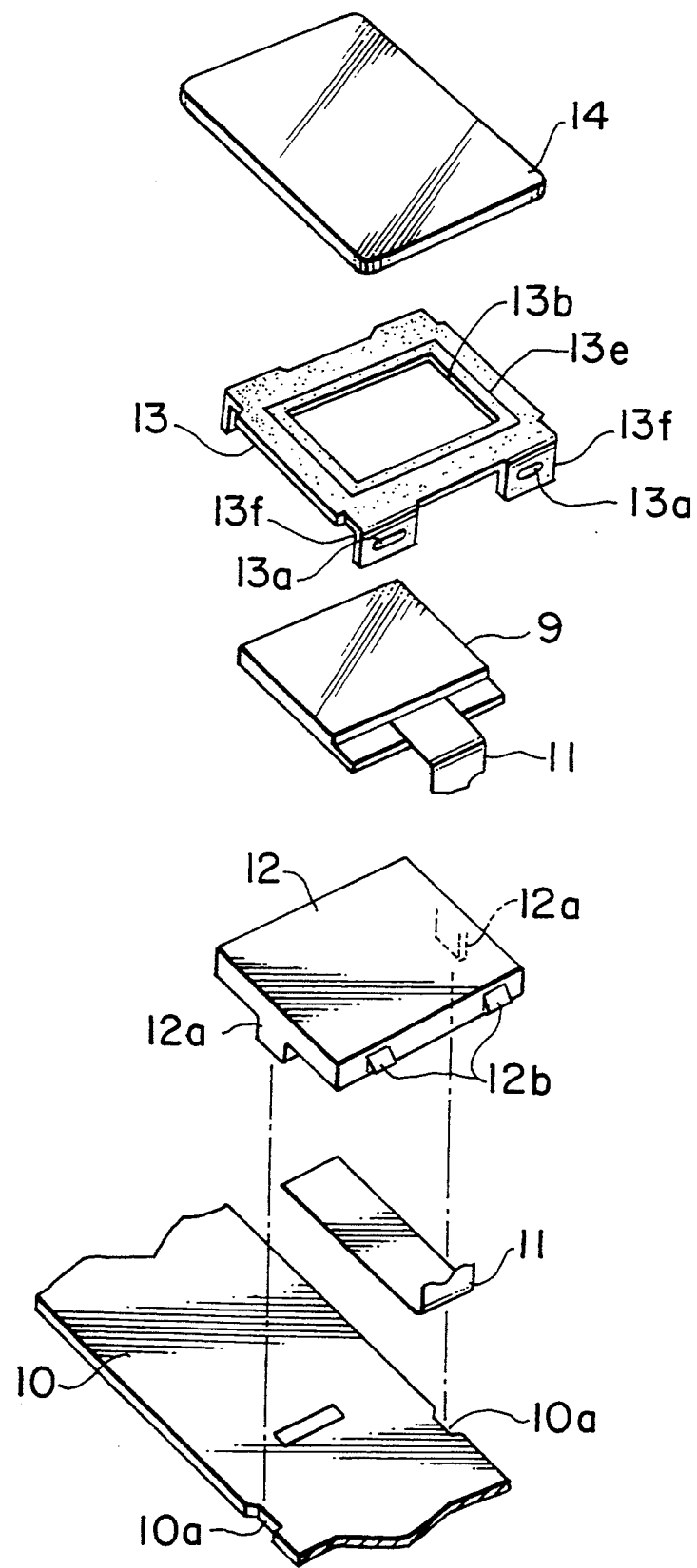
FIG. 1 is an exploded perspective view of a display means for an apparatus according to the present invention.
Figure 2:
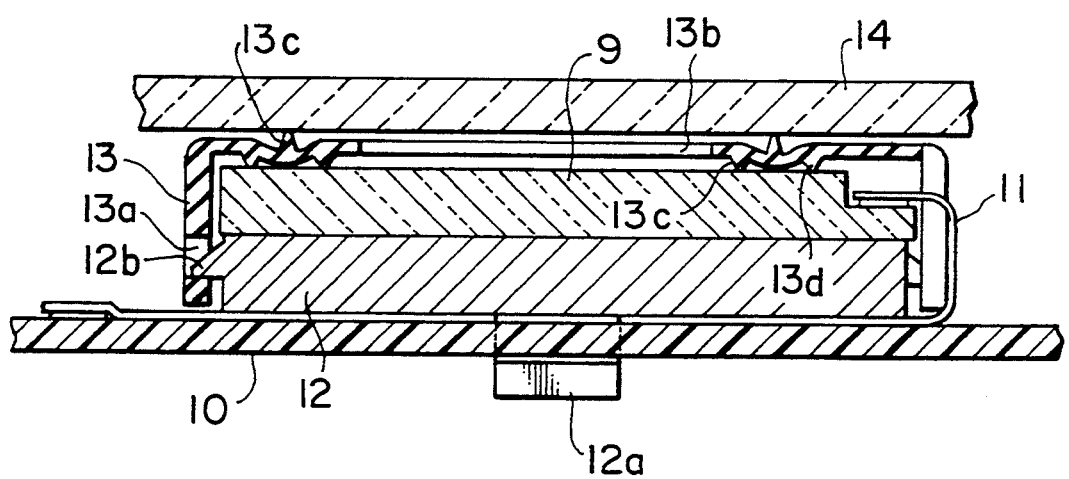
FIG. 2 is a sectional view of a display means for an apparatus according to the present invention.
Figure 4:
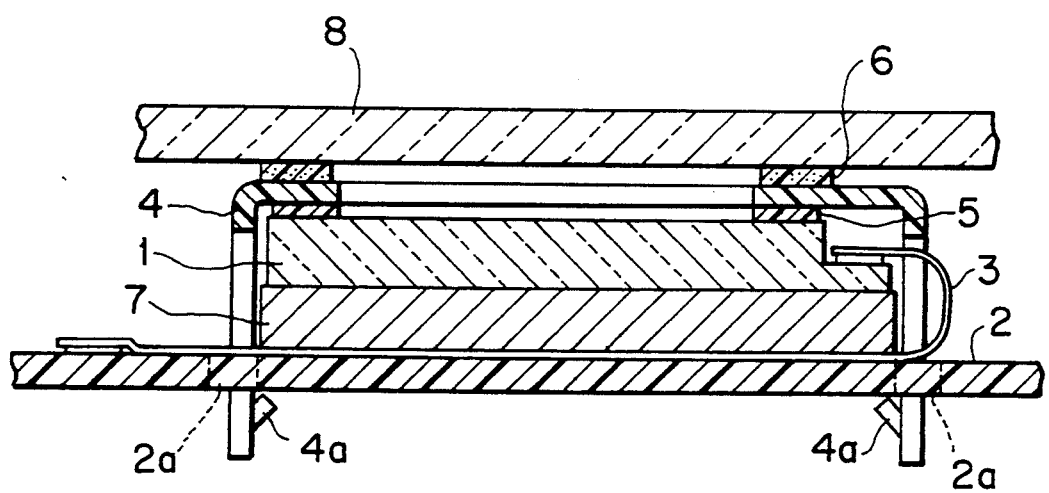
FIG. 4 is a sectional view of a prior display means for an apparatus.
Figure 3:
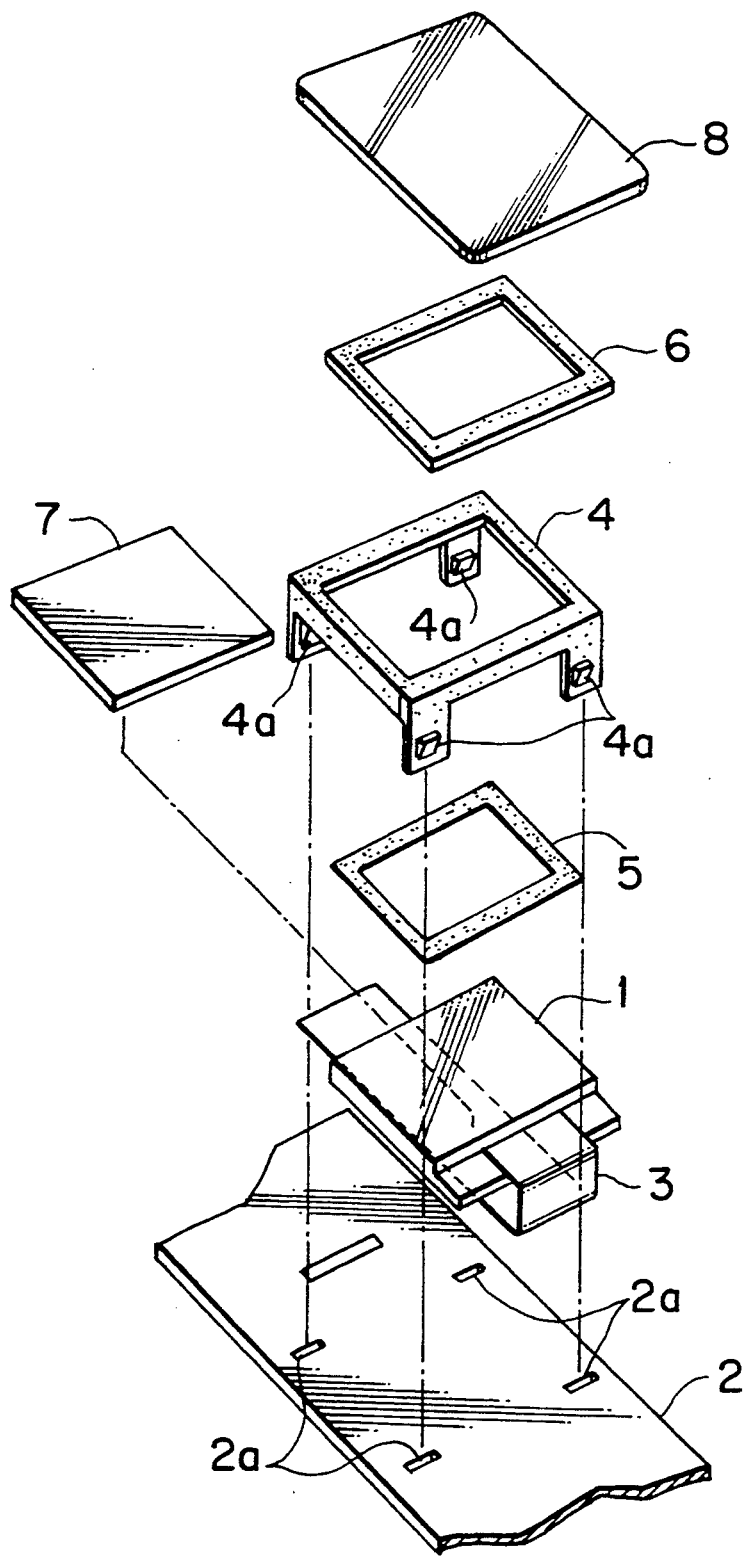
FIG. 3 is an exploded perspective view of a prior display means for an apparatus.

Referring to the accompanying drawing, one embodiment according to the present invention will be described hereafter. FIG. 1 is an exploded perspective view of a display means for an apparatus according to the present invention. FIG. 2 is a sectional view of a display means for an apparatus according to the present invention.

Referring to FIG. 1, reference numeral 9 is an L.C.D. panel, the L.C.D. panel is provided with a printed circuit board 10 and a flexible printed circuit board 11 for connecting the panel 9 to board 10. Reference numeral 12 is a backlighting plate, on the underside surface of which, tabs 12a are formed to engage with notches 10a which are provided on printed circuit board 10, and projections 12b are formed on the side of backlighting plate 12. The backlighting plate 12 usually is an unit into which a light source such as light emitting diode(LED) is incorporated, and transmits light toward L.C.D. panel 9 upward.

Reference numeral 13 is an elastic packing like a rubber packing for holding L.C.D. panel 9, in which plane rectangle opening 13b is formed, on the sides of which a pair of fitting legs 13f are provided right and left respectively, and slits 13a are formed on fitting legs 13f so as to engage with projections 12b of said backlighting plate 12. As shown in FIG. 2, a continuous inside ridge 13c and outside ridge 13d are formed in parallel on the surface of which the elastic packing 13 contacts with the L.C.D. panel 9 so as to enclose said opening 13b, and a continuous central ridge 13e is formed on the surface of which elastic packing 13 contacts with the transparent panel 14 so as to enclose said opening, ridge 13e is positioned at the portion corresponding to the middle between inside ridge 13c and outside ridge 13d, and those ridges 13c, 13e, and 13d are arranged zigzag with respect to one another on opposing surfaces of the elastic packing 13.

Said transparent panel 14 is made of a transparent material so that a display of L.C.D. panel 9 can be observed.

As shown in FIG. 2, backlighting plate 12 is fixed to printed circuit board 10 by engaging tabs 12a formed on the underside surface of plate 12 with notches 10a of printed circuit board 10. In this fixing, flexible printed circuit board 11 is disposed under backlighting plate 12, and the end of which is bent back toward the L.C.D. panel 9 by 180 degrees, and L.C.D. panel 9 is mounted on backlighting plate 12.

Elastic packing 13 then is set on L.C.D. panel 9. Elastic packing 13 may be fixed to printed circuit board 10 by hooking slits 13a formed on its legs 13f on projections 2b of backlighting plate 12, thus, L.C.D. panel 9 is held. In this state of fabrication, each of inside and outside ridges 13c, 13d closely contacts with L.C.D. panel 9, and central ridge 13e does with transparent panel 14.

Since inside and outside ridges 13c, 13d and central ridge 13e on the opposite side are arranged zigzag with respect to one another on opposing surfaces of the elastic packing 13, those ridges act like a spring in cushioning and can absorb the compressive force. This closed contact protects the L.C.D. panel 9 from an impact from the outside, and prevents refuse and dust from entering the display area.

Thus, the above embodiment has an effect of holding L.C.D. panel 9, protection from an outside impact, and prevention of refuse and dust entering the display area, only by elastic 13.

As apparent from the above embodiment, since an elastic packing is employed to hold an L.C.D. panel, the display means in accordance with the present invention has an effect of being able to simultaneously realize holding of the L.C.D. panel, protection from an outside impact, and prevention of refuse and dust entering the display area.

Moreover, according to the present invention, the display means also may be arranged so that the number of components composing the display device is less than those of conventional devices and a height of the display device can be made lower, thereby, the display device has an effect of providing a smaller and lower-priced display means for an apparatus.

What is claimed is:

1. A display means for an apparatus, comprising:
   a printed circuit board having an integrated circuit for controlling display information;
   a backlighting plate fixed on the printed circuit board;
   an L.C.D, panel Which is disposed on the backlighting plate, and is electrically connected With said printed circuit board through a flexible circuit board;
   a transparent panel for covering the L.C.D. panel, located above said L.C.D. panel; and
   an elastic packing which is formed integrally between said L.C.D. panel and said transparent panel to protect said L.C.D. panel from shock and to prevent dust from entering between said L.C.D. panel and said transparent panel, and is fixed to said backlighting plate to hold the L.C.D. panel to the backlighting plate,
   wherein a plurality of continuous ridges are formed on a first surface of said elastic packing which contacts said L.C.D. panel so as to enclose an opening formed in said elastic packing, and a continuous ridge is formed on a second surface of said elastic packing which contacts said transparent panel so as to enclose said opening, the ridges being positioned zigzag with respect to one another on said first and second surfaces of said elastic packing wherein said ridge on said second surface is located between two of said ridges on said first surface.

* * * * *